United States Patent [19]

Göbel et al.

[11] Patent Number: 4,740,978
[45] Date of Patent: Apr. 26, 1988

[54] INTEGRATED QUANTUM WELL LASERS HAVING UNIFORM THICKNESS LASING REGIONS FOR WAVELENGTH MULTIPLEXING

[75] Inventors: Ernst O. Göbel, Leinfelden; Klaus Ploog, Stuttgart; Helmut Jung, Stuttgart; Jürgen Kuhl, Stuttgart; Reiner Höger, Möglingen, all of Fed. Rep. of Germany

[73] Assignee: Max-Planck-Gesellschaft zur Foerderung der Wissenschaften e.V., Goettingen, Fed. Rep. of Germany

[21] Appl. No.: 834,987

[22] Filed: Feb. 28, 1986

[30] Foreign Application Priority Data

Mar. 14, 1985 [EP] European Pat. Off. ........ 85102955.3
Apr. 19, 1985 [EP] European Pat. Off. ........ 85104758.9

[51] Int. Cl.$^4$ ............................................. H01S 3/19
[52] U.S. Cl. ...................... 372/50; 372/23; 372/46; 372/49
[58] Field of Search ............ 372/50, 45, 46, 49, 372/23

[56] References Cited

U.S. PATENT DOCUMENTS 4,318,059 3/1982 Lang et al. ............................ 372/47
4,476,563 10/1984 Van Ruyren ......................... 372/50
4,577,207 3/1986 Copeland ............................. 357/17
4,577,321 3/1986 Carney et al. ....................... 372/50
4,607,370 8/1986 Mukai et al. ........................ 372/50
4,627,065 12/1986 Logan et al. ........................ 372/50

Primary Examiner—James W. Davie
Attorney, Agent, or Firm—Townsend & Townsend

[57] ABSTRACT

A semiconductor laser device comprises a plurality of layers of semiconducting materials, first contact means providing electrical contact to a basal layer of the device and second contact means providing electrical contact to an upper layer of the device, with at least one layer disposed between the basal layer and the upper layer being selected to be sufficiently thin that size quantization occurs, i.e. that a semiconductor device with a quantum well structure is created. The second contact means comprises a first strip-like contact overlying a first lasing region of the device and a second strip-like contact overlying a second lasing region of the device. The light losses associated with photons generated by laser action in the first region are intentionally made different from the light losses associated with photons generated by laser action in the second region which permits laser action at two distinct wavelengths in a monolithic device.

16 Claims, 2 Drawing Sheets

INTEGRATED QUANTUM WELL LASERS HAVING UNIFORM THICKNESS LASING REGIONS FOR WAVELENGTH MULTIPLEXING

BACKGROUND OF THE INVENTION

The present invention relates to improved semiconductor laser devices and has particular reference to semiconductor laser devices in which one or more of the active layers is made sufficiently thin that size quantization occurs.

Semiconductor lasers based on conventional heterostructures, for example of GaAs-AlGaAs or GaInPAs-InP, are commercially available and represent one of the important components used in the fields of optical communications technology, optical data storage and integrated electrooptical circuitry (integrated optics). A useful summary of the charateristics of such devices is provided in the paper "Heterostructure Semiconductor Lasers Prepared by Molecular Beam Epitaxy" by W. T. Tsang published in the IEEE Journal of Quantum Electronics, vol. QE-20, No. 10, October 1984, pages 1119 to 1132. This articles also discloses a variety of novel semiconductor laser structures which include at least one ultra-thin layer disposed in the active zone of the device, with this ultra-thin layer being sufficiently thin that size quantization occurs which has far reaching effects on the physical properties of the laser devices. Each of the known types of semiconductor laser devices lases at a wavelength particular to that device and it is only possible to shift this wavelength by a small amount generally not greater than 5 nm. This is however a significant restriction because it would be desirable in many potential applications of semiconductor laser devices to have available a device which is capable of operating at two or more distinct emission wavelengths, for example for "wavelength multiplexing". A satisfactory semiconductor laser device of this kind has however, so far as can be ascertained, not yet been reported.

SUMMARY OF THE INVENTION

The object underlying the present invention is to provide a monolithic semiconductor laser device which can be selectively operated to lase at at least two distinct wavelengths which are separated from one another by an amount greater than 5 nm, and preferably by an amount of the order of magnitude of 50 nm or more. Futhermore, the device should also be relatively inexpensive, have a long working life, and be simple to manufacture using established techniques.

In order to satisfy this object there is provided, starting from the concept of "quantum well" devices of the general kind disclosed in the Tsang paper, a semiconductor laser device comprising a plurality of layers of semiconducting materials wherein at least one intermediate layer is selected to be sufficiently thin that size quantization occurs, characterised in that the device has first and second lasing regions and is configured so that light losses associated with photons generated by laser action in said first region are different from the light losses associated with photons generated by laser action in said second region.

A semiconductor laser device of this kind is capable of lasing at two distinct wavelengths which can differ by a substantial amount, for example 50 nm is very advantageous. The inventive concept is based on four realisations, namely:

(a) that a plot of gain against wavelength for a device having a quantum well structure, as a result of size quantization, is not a smooth generally parabolic curve as is for example the case for a conventional double heterostructure, but is instead a step function, with the steps having vertical transistions at distinct wavelengths, (b) that laser action only occurs when the gain of the device is sufficient to compensate for light losses in the device, (c) that it is possible to construct a monolithic device such that the light losses in a first lasing region are different from the light losses in a second lasing region, and (d) that by selectively energising the first and second lasing regions it is possible, as a result of the stepped shape of the gain versus wavelength curve, to cause the device to operate at two distinct and widely separated wavelengths.

The device of the invention can be pumped optically in order to generate the desired laser action. As an alternative the device of the invention can be energised electrically via metallic contacts. Thus, in one form of the invention, the semiconductor device further comprises first contact means providing electrical contact to a basal layer of said device and second contact means providing elctrical contact to an upper layer of said device, as known per se, and is charcterised in the said second contact means comprises a first strip-like contact overlying said first lasing region of said device and a second strip-like contact overlying said second lasing region of said device.

One physical realisation of this embodiment is characterised in that the two different regions are defined by strip-like contacts (stripe contacts) and in that said first and second strip-like contacts extend parallel to each other but laterally spaced apart over said upper layer.

This embodiment is easy to manufacture using customary techniques.

With an arrangement of this kind a first end face region of said device associated with said first strip-like contact and said first region can be provided with a partially reflective coating to vary the level of light loss at said first end face region relative to the light loss at a second end face region associated with said second strip-like contact and said second region.

This variant can be easily realised using conventional coating techniques.

Alternatively, the different light losses can be realised by selecting the length of the first and second strip-like contacts to be different from each other, whereby to vary the light losses and optical gain associated with said first and second regions. This embodiment is particularly advantageous because no coating of the end faces of the device is necessary.

In a particularly simple embodiment, which nevertheless has substantial technological potential, the first and second strip-like contacts extend substantially co-linear to each other. In such an arrangement the first and scond strip-like contacts are preferably of different lengths and spaced apart from one another by a small amount. This arrangement is particularly advantageous as a suitable choice of composition and dimensions can lead to a device which alternately emits at first the one wavelength and then the other with a very high change over frequency. This device is thus a type of optical multivibrator and its high speed switching properties can readily be exploited in the communication and computer fields for multiplexing and switching applications. Both bistable and monostable forms of operation should be possible.

The invention can be put into practice using all the conventional semiconductor laser materials which have a direct band gap. The III-V and IV-VI semiconductor materials are particularly important. The semiconductor laser devices are preferably grown by molecular beam epitaxy (MBE) which is particularly favourble for growing the ultra-thin layers necessary to achieve size quantization (typically less tha 20 nm in thickness). However, also other epitaxial thin film growth techniques, like vapor phase epitaxy, may be used for growth of the laser materials. An advantage of the present invention is that the thickness of the active or lasing regions is uniform.

DESCRIPTION OF THE PREFERRED EMBODIMENTS

Figure 1:
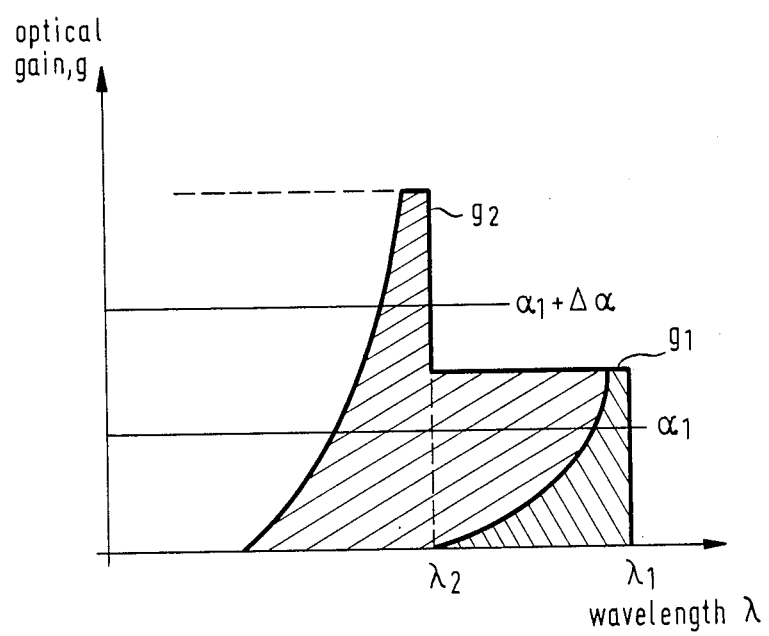
FIG. 1 a plot of the variation in gain $g_1$, $g_2$ with wavelength for a typical semiconductor laser device having a quantum well structure for two different excitations of the semiconductor device, FIG. 2 a schematic illustration of a first semiconductor laser device in accordance with the invention, and FIG. 3 a second schematic illustration of an alternative semiconductor laser device in accordance with the present invention.

Referring firstly to FIG. 1 there can be seen a schmatic illustration of the variation in optical gain as a function of the emission wavelength for a semiconductor laser device having a quantum well structure. Laser emission occurs when the optical gain g exceeds the losses $\alpha$ (absorption, scattering etc.) Whereas a small change in the optical losses in a conventional semiconductor laser structure would only lead to a minimal displacement of the emission wavelength, a small change in the opticaal losses in a semiconductor laser device having a quantum well structure can produce a very large change in the emission wavelength if the appropriate parameters are suitably chosen. By way of example, if the light losses occurring in a semiconductor laser device having the characteristic shown in FIG. 1 lie at the level $\alpha 1$ then operation of this device with an optical gain $g1$ will result in laser operation at wavelength $\lambda 1$.

If the same device is now modified so that the light losses increase by the amount $\Delta\alpha$ to $\alpha 1 + \Delta\alpha$ then operation at an optical gain factor $g2$ will result in laser operation at the wavelength $\lambda 2$.

It is important to realise that some step has to be taken to change the level of light losses associated with the device in question in order to obtain laser operation at the distinct wavelengths required.

Figure 2:
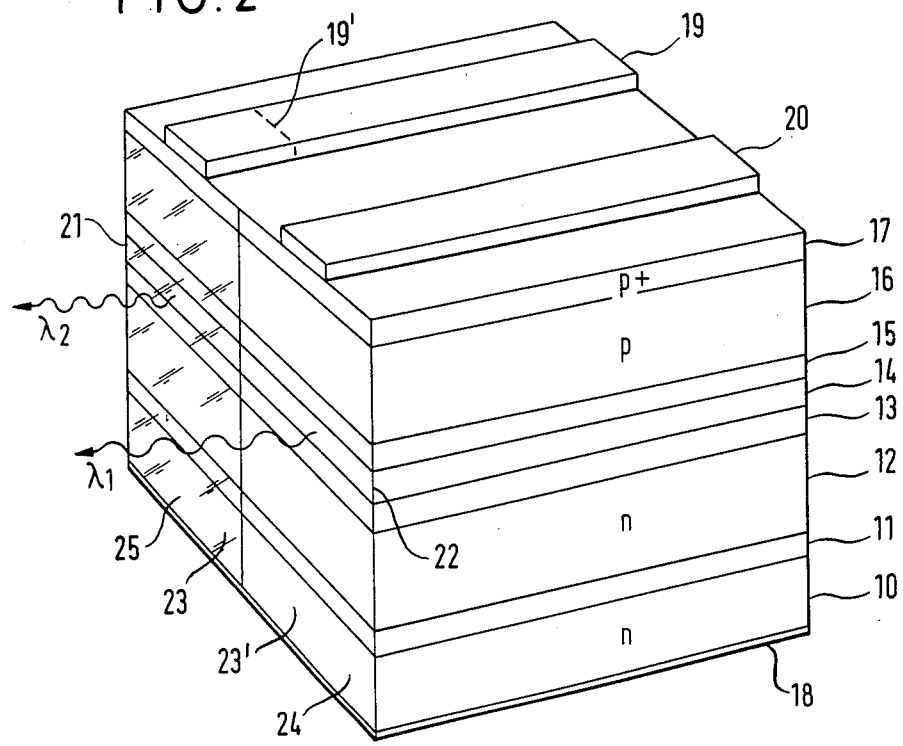

The embodiment of FIG. 2 shows one way of achieving this goal.

The semiconductor laser device of FIG. 2 comprises a well known GaAs n-type substrate 10 onto which there is first grown a GaAs buffer layer 11 of 0.1 microns to 0.5 microns thickness. This buffer layer ensures a rgular crystallographic structure. A layer 12 of $GA_{1-x}Al_xAs$ of n-type material with x typically equal to 0.4 and a thickness of typically $1\mu$ is grown onto the buffer layer 11. This layer 12 is followed by a further layer 13 of $Ga_{1-y}Al_yAs$ in whciih y is typically equal to 0.2. Layer 13 has a thickness of approximately 10 nm and is followed by a further layer 14 of $Ga_{1-z}Al_zAs$ with z between 0.1 and 0 and a layer thickness of less than 20 nm and in particular less than 15 nm. This ultra-thin layer 14 is followed by a further ultra-thin layer 15 of the same composition and thickness as the layer 13, i.e. a layer of $Ga_{1-y}Al_yAs$ with y approximately equal to 0.2 and a layer thickness of 10 nm. These three ultra-thin layers, which have a thickness such that size quantization occurs are then followed by a layer 16 of p-type material which is again $Ga_{1-x}Al_xAs$ with x approximately equal to 0.4. This layer 16 of p-type material has a thickness of approximately $1\mu$ and is followed by a thinner layer of GaAs (thickness $0.1\mu$ to $0.5\mu$) which is doped so that it is a high p+ material (impurity concentration greater than $10^{18}$).

This semiconductor device is provided with first contact means 18 applied to a basal layer of the device, i.e. to the substrate 10. Second contact means is provided on an upper layer of the device, namely the GaAs layer 17 and takes the form a first strip-like contact 19 and a second strip-like contact 20. The first strip-like contact 19 overlies a first lasing region 21 of the device and the second strip-like contact 20 overlies a second lasing region 22 of the device. One half 23 of the end face 24 of the device is provided with a partially reflective coating, illustrated by the shading 25, so that optical losses associated with the first lasing region 21 differ from those associated with the second lasing region 22, where, in this case, the associated half 23' of the end face is not provided with a partially reflective coating. As a result one obtains a monolithic device in which the two lasing regions 21 and 22 emit respective coherent laser light having wavelengths $\lambda 1$ and $\lambda 2$ on suitable energisation of the injection electrodes 19 and 20.

It will be appreciated that the variation of the light losses between the two regions 21 and 22 is achieved in this embodiment by variation of the reflection of the crystal end faces of Fabry-Perot type semiconductor lasers.

Depending on the precise requiements it is also possible to provide the lasing region 22 with a partially reflective coating, which would however have a coefficient of reflection different from that of the region 21 so that different levels of light loss occur.

The device has been shown in simplified form with only one each of the first and second strip-like contacts. It will be appreciated that the structure may be repeated so that there are a plurality of first and second strip-like contacts 19 and 20 on one chip.

An alternative way of varying the light losses associated with the two lasing regions 21 and 22 of the embodiment of FIG. 2 would be to use strip-like contacts 19, 20 of different lengths, for example so that strip-like contact 19 terminates at 19'. This latter embodiment exploits the fact that the light losses are greater in regions which are not directly excited by an overlying contact electrode. Thus a change of the length of the contact electrode results in a change of the relative lengths of the excited and non-excited regions and hence in a change in the level of light loss which occurs.

Figure 3:
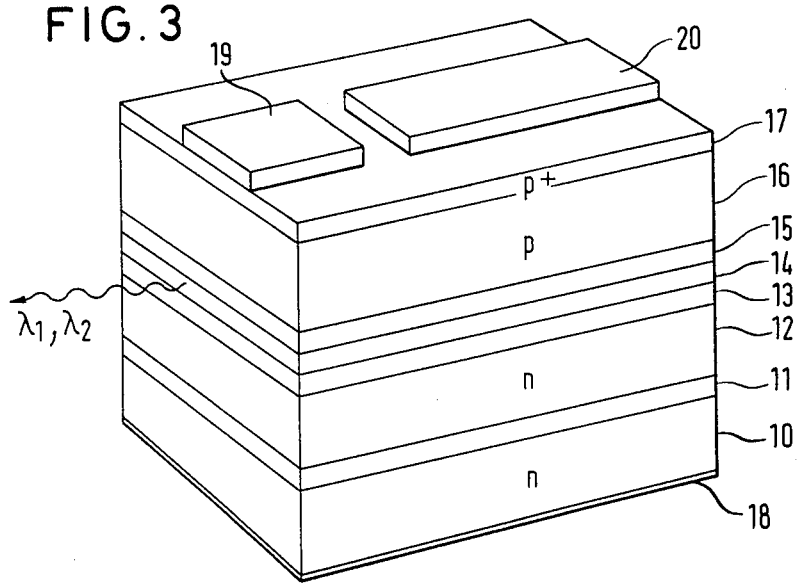

An alternative way of achieving laser operation at two distinct wavelengths will now be described with reference to the embodiment of FIG. 3. In this embodiment the basic structure of the semiconductor device is the same as in FIG. 2 which has been indicated by the use of the same reference numerals. However, in distinction to the embodiment of FIG. 2 the two strip-like electrodes 19 and 20 of the embodiment of FIG. 3 are not provided parallel to and spaced apart laterally from one another but are instead co-linear. The longer one of these stripes 20 acts as the laser active region, whereas the shorter stripe region acts as a variable loss controlled by the current through stripe 19. No coating of the end face 24 has been provided because this is not necessary as the light losses can be controlled by the current through one of the stripes, preferably through the shorter region.

The embodiment of FIG. 3 is thus again a monolithic structure in which the injection contact is interrupted and in which the current for each of the segments 19, 20 of the injection contact can be separtely regulated. It will also be understood, that the structure of FIG. 3 can be repeated so that a number of pairs of first and second strip-like contacts are arranged parallel to and spaced apart from one another on a single chip. The light losses which occur in this embodiment are attributed to the different lengths of the excited regions. The device according to FIG. 3 will be able to switch intrinsically between the at least two possible wavelengths with a frequency which can be controlled by the design parameters.

In both the embodiment of FIG. 2 and the embodiment of FIG. 3 the device will in practice be covered by a protective/insulating layer of an oxide, which is however not shown in the drawings.

In the embodiments shown in FIG. 2 and FIG. 3, light losses are varied and lasing is made to occur at two or more distinct wavelengths without varying the thickness of the active or lasing material. Uniform thickness of the active or lasing material enables the present invention to be readily fabricated.

It will be appreciated that although the above embodiments only disclose one specific semiconductor laser structure the invention can be applied to all known laser structures in which a quantum well structure of the energy bands can be produced by suitable choice of the thicknesses of the individual layers, such as multiple quantum well structures, structures with graded composition cladding layers, etc.

Furthermore, it will be clear to those skilled in the art that the variation of the level of light losses can be produced in ways other than those described. One particular way which is of importance is by suitable choice of the Bragg grid structures in distributed feedback lasers (DFB lasers). Such Bragg grid structures are well known in the field of semiconductor lasers and are used to produce feedback of the laser light generated in the crystal so as to obtain the desired laser action. The use of such structures, which produce feedback by diffraction is beneficial because it avoids the need for devices with reflective end faces. The grid structure is in effect a periodical modulation of the active zone produced by photolithography, with the periodicity of the structure being chosen so as to produce the desired diffraction effect, and the level of light losses can be controlled by controlling the amplitude of the sinusoidal variation (for example).

We claim:

1. A monolithic semiconductor laser capable of lasing at first and second different wavelengths, the laser comprising a semiconductor substrate; a plurality of epitaxial layers grown thereon to form at least one quantum well heterostructure having a first cladding region grown on said substrate, an active quantum well region comprising of alternating layers of first and second compositions grown on said first cladding region with at least one of said layers having a thickness such that size quantization occurs, and a second cladding region grown on said active region; means defining first and second lasing regions in said heterostructure, said first and second lasing regions having the same layer thickness and the same layer compositions; means for energizing said first and second lasing regions for generating laser action therein; and means for producing different optical losses in said first and second regions.

2. A monolithic semiconductor laser in accordance with claim 1, wherein said means for energizing said first and second regions for generating laser action therein comprises first and second strip-like contacts respectively overlying said first and second regions, and contact means disposed on an opposite side of said first and second regions from said first and second strip-like contacts.

3. A monolithic semiconductor laser in accordance with claim 2, wherein said means for producing different optical losses in said first and second regions comprises an arrangement in which a length of said first strip-like contact differs from a length of said second strip-like contact.

4. A monolithic semiconductor device in accordance with claim 2, wherein said first and second strip-like contacts extend parallel to and laterally spaced apart from each other.

5. A monolithic semiconductor device in accordance with claim 3, wherein said first and second strip-like contacts extend parallel to an laterally spaced apart from each other.

6. A monolithic semiconductor laser in accordance with claim 1, wherein said first region has a first end face region and said second region has a second end face region, and wherein said means for producing different optical losses in said first and second regions comprises a partially reflective coating at said first end face region to vary level of light loss at said first end face region relative to the light loss at said second end face region.

7. A monolithic semiconductor laser in accordance with claim 6, wherein said means for energizing said first and second regions for generating laser action therein comprises first and second strip-like contacts respectively overlying said first and second regions, and contact means disposed on an opposite side of said first and second regions from said first and second strip-like contacts.

8. A monolithic semiconductor laser in accordance with claim 1, wherein said first and second regions extend parallel to and laterally spaced apart from each other.

9. A monolithic semiconductor laser in accordance with claim 1, wherein said first and second regions are colinear and have a common active region, wherein said means for energizing said first and second regions for generating laser action therein comprises a first strip-like contact, overlying said common active region, and contact means disposed on an opposite side of said first and second regions from said first and second strip-like contacts, and wherein said means for producing different optical losses comprises a second contact disposed colinear to said first strip-like contact.

10. A monolithic semiconductor in accordance with claim 9, wherein said second contact is shorter than said first strip-like contact.

11. A monolithic semiconductor laser in accordance with claim 1, wherein said means for energizing said first and second regions for generating laser action therein comprises means for optically pumping said regions.

12. A monolithic semiconductor laser in accordance with claim 1, wherein said semiconductor laser comprises III-V semiconductor materials.

13. A monolithic semiconductor laser in accordance with claim 1, wherein said semiconductor laser comprises IV-V semiconductor materials.

14. A monolithic semiconductor laser in accordance with claim 1, wherein said epitaxial layers consist of $Ga_{1-x}Al_xAs$ material wherein x is substantially 0.4 in said cladding layers which have a thickness of substantially $1\mu$, wherein said alternating layers comprise a first layer of $Ga_{1-y}Al_yAs$ with y equal to substantially 0.2 and with said first layer having a thickness of substantially 10 nm, a second layer of $Ga_{1-z}A_zAs$ with z lying between 0.1 and 0 and with said second layer having a thickness less than 20 nm, and a third layer substantially the same as the first layer.

15. A monolithic semicondictor laser capable of lasing at first and second different wavelengths, the laser comprising a semiconductor substrate; a plurality of epitaxial layers grown thereon to form at least one quantum well heterostructure having a first cladding region grown on said substrate, an active quantum well region comprising alternating layers of first and second compositions grown on said first cladding region with at least one of said layers having a thickness such that size quantization occurs, and a second cladding region grown on said active region, first and second lasing regions defined alongside one another and parallel to one another in said heterostructure with said lasing regions having the same layer thickness and the same layer compositions in said active quantum well region; said first lasing region having a first end face and said second lasing region having a second end face; a partially reflective coating provided at said first end face to produce a different light loss in said first lasing region from that in said second lasing region; and first and second contacts arranged parallel to and spaced apart from each other and overlying said first and second lasing regions for energizing the same to produce laser action thereof.

16. A monolithic semiconductor laser capable of lasing at first and second different wavelengths, the laser comprising a semiconductor substrate; a plurality of epitaxial layers grown thereon to form at least one quantum well heterostructure having a first cladding region grown on said substrate, an active quantum well region comprising alternating layers of first and second compositions grown on said first cladding region with at least one of said layers having a thickness such that size quantization occurs, and a second cladding region grown on said active quantum well region; an active lasing region defined in said active quantum well region of said heterostructure; and a first contact overlying said active lasing region for enegizing the same to produce laser action therein, a second contact disposed colinear to said first contact overlying part of said quantum well structure colinear with said active lasing region and means for electively energizing said second contact to vary the level of light loss associated with said active lasing region to selectively cause operation of said semiconductor laser at said first and second wavelengths.

* * * * *